United States Patent
Davis (10) Patent No.: US 9,361,968 B2
(45) Date of Patent: Jun. 7, 2016

(54) NON-VOLATILE RANDOM ACCESS MEMORY POWER MANAGEMENT USING SELF-REFRESH COMMANDS

(71) Applicant: LENOVO (Singapore) PTE, LTD., New Tech Park (SG)

(72) Inventor: Mark Charles Davis, Durham, NC (US)

(73) Assignee: Lenovo (Singapore) PTE. LTD., New Tech Park (SG)

( * ) Notice: Subject to any disclaimer, the term of this patent is extended or adjusted under 35 U.S.C. 154(b) by 0 days.

(21) Appl. No.: 14/156,245

(22) Filed: Jan. 15, 2014

(65) Prior Publication Data

US 2015/0200004 A1 Jul. 16, 2015

(51) Int. Cl.
| | |
|---|---|
| *G11C 11/406* | (2006.01) |
| *G11C 5/14* | (2006.01) |
| *G11C 7/20* | (2006.01) |
| *G11C 11/00* | (2006.01) |
| G11C 14/00 | (2006.01) |
| G11C 13/00 | (2006.01) |
| G11C 16/30 | (2006.01) |

(52) U.S. Cl.
CPC ............ *G11C 11/40615* (2013.01); *G11C 5/14* (2013.01); *G11C 5/148* (2013.01); *G11C 7/20* (2013.01); *G11C 11/005* (2013.01); *G11C 11/406* (2013.01); *G11C 11/40603* (2013.01); *G11C 13/0038* (2013.01); *G11C 14/0009* (2013.01); *G11C 16/30* (2013.01)

(58) Field of Classification Search
CPC ............ G11C 11/40615; G11C 11/005; G11C 11/406; G11C 11/40603; G11C 5/14; G11C 5/148; G11C 7/20; G11C 14/0009; G11C 13/0038; G11C 16/30

USPC .................. 365/222, 185.08, 233.13
See application file for complete search history.

(56) References Cited

U.S. PATENT DOCUMENTS

| | | | |
|---|---|---|---|
| 8,145,833 B1 | 3/2012 | Duan | |
| 2006/0104141 A1* | 5/2006 | Jo ................. | G11C 11/406 365/222 |
| 2008/0209117 A1 | 8/2008 | Kajigaya | |
| 2009/0187689 A1* | 7/2009 | Roohparvar ......... | G11C 11/406 710/100 |
| 2010/0202240 A1* | 8/2010 | Moshayedi .............. | G11C 5/04 365/229 |
| 2011/0055671 A1* | 3/2011 | Kim .................... | G06F 11/1028 714/800 |
| 2011/0194358 A1* | 8/2011 | Choi ..................... | G11C 5/148 365/189.02 |
| 2014/0013034 A1 | 1/2014 | Kown et al. | |
| 2014/0189198 A1 | 7/2014 | Siddiqi et al. | |
| 2014/0226400 A1* | 8/2014 | Kimura ................. | G06F 1/3225 365/185.08 |
| 2014/0281736 A1* | 9/2014 | Kong .................... | G11C 29/44 714/42 |
| 2015/0149715 A1 | 5/2015 | Davis | |

OTHER PUBLICATIONS

U.S. Appl. No. 14/092,444 Office Action dated Jun. 29, 2015.

\* cited by examiner

*Primary Examiner* — Vu Le
*Assistant Examiner* — Sung Cho
(74) *Attorney, Agent, or Firm* — Kunzler Law Group (57) ABSTRACT

For non-volatile random access memory (NVRAM) power management using self-refresh commands, a low-power module intercepts a memory self-refresh command and powers down an NVRAM in response to the memory self-refresh command. A resumption module intercepts a self-refresh exit command and powers up the NVRAM in response to the self-refresh exit command.

17 Claims, 7 Drawing Sheets

| DRAM Command 305 | NVRAM Action 310 |
|---|---|
| Enter Self-Refresh Command | Power Down Command |
| Exit Self-Refresh Command | Power Up Command |

| Memory Command 305 | NVRAM Action 310 | NVRAM Power Action 315 |
|---|---|---|
| Enter Self-Refresh Command | Power Down Command | Power Off Command |
| Exit Self-Refresh Command | Power Up Command | Power On Command |

NON-VOLATILE RANDOM ACCESS MEMORY POWER MANAGEMENT USING SELF-REFRESH COMMANDS

FIELD

The subject matter disclosed herein relates to non-volatile random access memory (NVRAM) power management and more particularly relates to NVRAM power management using self-refresh commands.

BACKGROUND

Description of the Related Art

Power management is important to many electronic devices. NVRAM may be powered down to reduce power consumption.

BRIEF SUMMARY

An apparatus for NVRAM power management using self-refresh commands is disclosed. The apparatus includes a low-power module and resumption module. The low-power module intercepts a memory self-refresh command and powers down an NVRAM in response to the memory self-refresh command. The resumption module intercepts a self-refresh exit command and powers up the NVRAM in response to the self-refresh exit command. A method and computer program product also perform the functions of the apparatus.

BRIEF DESCRIPTION OF THE DRAWINGS

A more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

As will be appreciated by one skilled in the art, aspects of the embodiments may be embodied as a system, method or program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a program product embodied in one or more computer readable storage devices storing machine readable code, computer readable code, and/or program code, referred hereafter as code. The storage devices may be tangible, non-transitory, and/or non-transmission. The storage devices may not embody signals. In a certain embodiment, the storage devices only employ signals for accessing code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in code and/or software for execution by various types of processors. An identified module of code may, for instance, comprise one or more physical or logical blocks of executable code which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different computer readable storage devices. Where a module or portions of a module are implemented in software, the software portions are stored on one or more computer readable storage devices.

Any combination of one or more computer readable medium may be utilized. The computer readable medium may be a computer readable storage medium. The computer readable storage medium may be a storage device storing the code. The storage device may be, for example, but not limited to, an electronic, magnetic, optical, electromagnetic, infrared, holographic, micromechanical, or semiconductor system, apparatus, or device, or any suitable combination of the foregoing.

More specific examples (a non-exhaustive list) of the storage device would include the following: an electrical connection having one or more wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Code for carrying out operations for embodiments may be written in any combination of one or more programming languages, including an object oriented programming language such as Java, Smalltalk, C++ or the like and conventional procedural programming languages, such as the "C"

programming language or similar programming languages. The code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all of the items are mutually exclusive, unless expressly specified otherwise. The terms "a," "an," and "the" also refer to "one or more" unless expressly specified otherwise.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and program products according to embodiments. It will be understood that each block of the schematic flowchart diagrams and/or schematic block diagrams, and combinations of blocks in the schematic flowchart diagrams and/or schematic block diagrams, can be implemented by code. These code may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The code may also be stored in a storage device that can direct a computer, other programmable data processing apparatus, or other devices to function in a particular manner, such that the instructions stored in the storage device produce an article of manufacture including instructions which implement the function/act specified in the schematic flowchart diagrams and/or schematic block diagrams block or blocks.

The code may also be loaded onto a computer, other programmable data processing apparatus, or other devices to cause a series of operational steps to be performed on the computer, other programmable apparatus or other devices to produce a computer implemented process such that the code which execute on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and program products according to various embodiments. In this regard, each block in the schematic flowchart diagrams and/or schematic block diagrams may represent a module, segment, or portion of code, which comprises one or more executable instructions of the code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and code.

The description of elements in each figure may refer to elements of proceeding figures. Like numbers refer to like elements in all figures, including alternate embodiments of like elements.

Figure 1A:
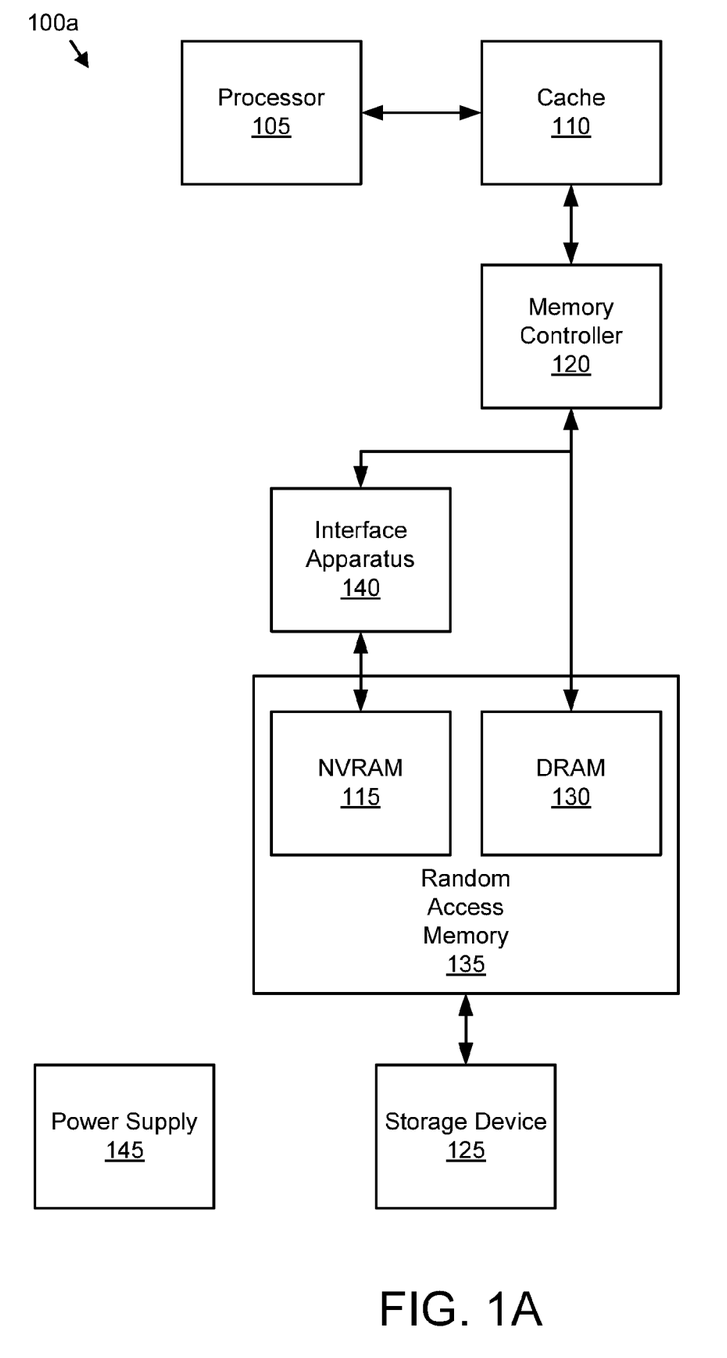
FIG. 1A is a schematic block diagram illustrating one embodiment of a computing device.

FIG. 1A is a schematic block diagram illustrating one embodiment of a computing device 100a. The computing device 100a may be a computer workstation, a laptop computer, a tablet computer, a mobile phone, a server, an eyeglass computer, a wearable computer, or the like. The computing device 100a includes a processor 105, a cache 110, a memory controller 120, a random-access memory 135, a storage device 125, and a power supply 145. The processor 105, cache 110, memory controller 120, random-access memory 135, storage device 125, and power supply 145 are also referred to as components.

The storage device 125 may be a nonvolatile storage device such as semiconductor storage device, a hard disk drive, an optical storage device, a micromechanical storage device, or combinations thereof. The storage device 125 may store large quantities of code for the computing device 100a.

The power supply 145 may supply power to the processor 105, the cache 110, the memory controller 120, the interface apparatus 140, the random-access memory 135, and the storage device 125. In one embodiment, the power supply 105 may selectively supply power to one or more components of the computing device 100a.

When the computing device 100a is booted, the processor 105 may request code from the memory controller 120. The memory controller 120 may copy the data from the storage device 125 to the random-access memory 135. Typically, the data that are actively used by the processor 105 are stored in the random-access memory 135. In addition, copies of frequently used data may be stored in the cache 110. The cache 110 may provide a low-latency storage space that is synchronized with the random-access memory 135 as is well known to those of skill in the art.

In the depicted embodiment, the random-access memory 135 comprises both NVRAM 115 and dynamic random access memory (DRAM) 130. The NVRAM 115 may be magnetoresistive random-access memory (MRAM). The NVRAM 115 may retain code and data, hereinafter referred to as code, when the computing device 100a is powered down. Thus when the computing device 100a is powered up, the code retained by the NVRAM 115 may allow the computing device 100a to rapidly be fully operational.

The DRAM 130 may be placed in a self-refresh mode to reduce the power consumption of the DRAM 130. In the self-refresh mode, the memory controller 120 may enter a low-power state and stop controlling and/or refreshing the DRAM 130. The DRAM 130 employ internal refresh and address controls to refresh the data stored in the DRAM 130, greatly reducing the power consumption of the memory controller 120 and DRAM 130.

The NVRAM 115 may also be powered down to reduce the power consumption of the computing device 100a. Unfortunately, the commands that place the DRAM 130 in the self-refresh mode are incompatible with the NVRAM 115. The embodiments described herein manage the power of the NVRAM 115 using the self-refresh commands generated for the DRAM 130 has will be described hereafter. Thus an existing memory controller 120 may also manage the power consumption of the NVRAM 115 in the random-access memory 135 along with the DRAM 130.

The interface apparatus 140 may intercept a memory self-refresh command from the memory controller 120 and intended for the DRAM 130 and power down the NVRAM 115 in response to the memory self-refresh command. In addition, the interface apparatus 140 may intercept a self-refresh exit command from the memory controller 120 and intended for the DRAM 130 and power up the NVRAM 115 in response to the memory wait command as will be described hereafter.

Figure 1B:
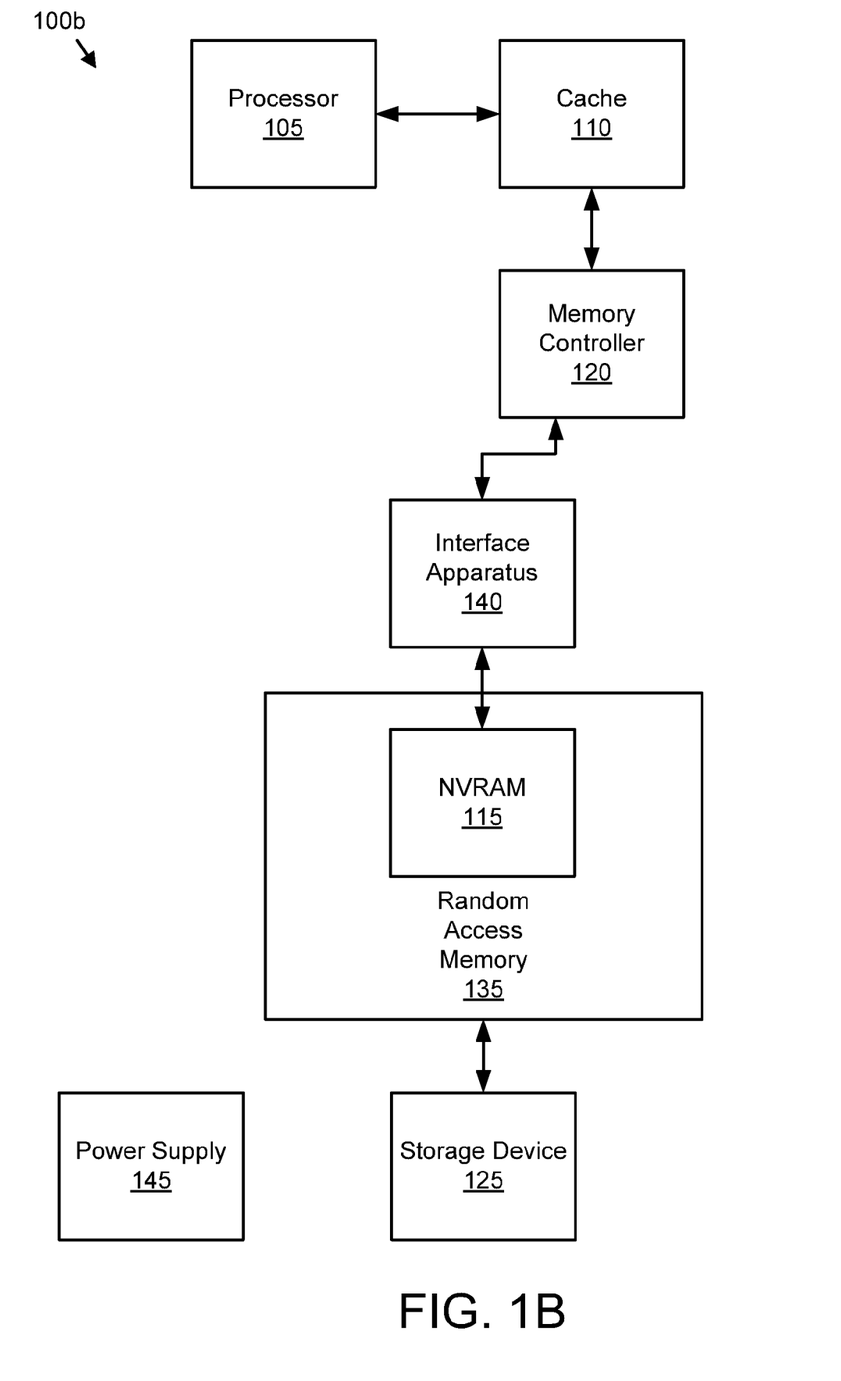
FIG. 1B is a schematic block diagram illustrating one alternate embodiment of a computing device.

FIG. 1B is a schematic block diagram illustrating one alternate embodiment of a computing device 100b. The computing device 100b is the computing device 100a of FIG. 1A. However, the computing device 100b is depicted with only NVRAM 115 in the random-access memory 135.

In one embodiment, a memory controller 120 that is configured to manage the power consumption of DRAM 130 may be used to manage the power consumption of the NVRAM 115. The interface apparatus 140 may intercept a memory self-refresh command from the memory controller 120 and power down the NVRAM 115 in response to the memory self-refresh command. In addition, the interface apparatus 140 may intercept a self-refresh exit command from the memory controller 120 and power up the NVRAM 115 in response to the self-refresh exit command.

Figure 2:
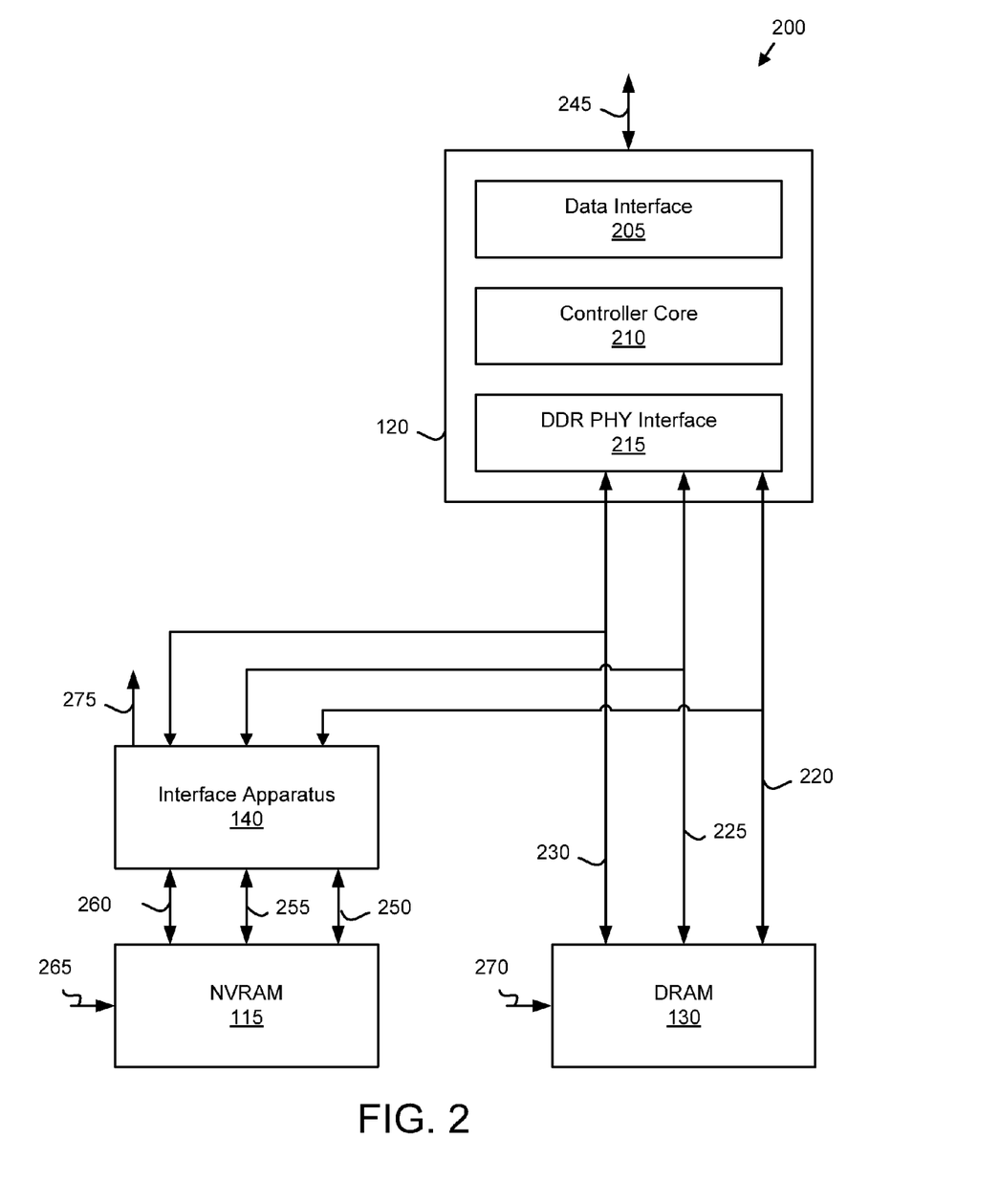
FIG. 2 is a schematic block diagram illustrating one embodiment of a memory subsystem.

FIG. 2 is a schematic block diagram illustrating one embodiment of a memory subsystem 200. The memory subsystem 200 may include the memory controller 120, the interface apparatus 140, the NVRAM 115, and the DRAM 130 of FIG. 1A. In one embodiment, the memory controller 120, the interface apparatus 140, the NVRAM 115, and the DRAM 130 are semiconductor devices. Each semiconductor device may be packaged separately. Alternatively, one or more of semiconductor devices may be integrated into a single semiconductor device and/or may be integrated into a common package.

The memory controller 120 may interface with a data bus 245. The data bus 245 may communicate directly and/or indirectly with the cache 110 and/or the storage device 125.

In the depicted embodiment, the memory controller includes a data interface 205, a controller core 210, and a double data rate (DDR) physical (PHY) interface 215. The data interface 205 may communicate with the data bus 245. The controller core 210 may comprise a sequencer and/or state machine logic that controls the DRAM 130 and/or NVRAM 115 through the DDR PHY interface 215. The DDR PHY interface 215 may conform to the Joint Electron Device Engineering Council (JEDEC) Low-power Double Data Rate (LPDDR) standard, the JEDEC, LPDDR2 standard, the double data rate (DDR) 4 standard, or like standards. In the depicted embodiment, the DDR PHY interface 215 includes a data/address bus 230, a command bus 225, and a clock bus 220.

The memory controller 120 may control the DRAM 130 through the data/address bus 230, the command bus 225, and the clock bus 220. The data/address bus 230 may provide data and address signals to the DRAM 130. The command bus 225 may communicate commands to the DRAM 130. The clock bus 220 may provide one or more clock signals for the DRAM 130.

The interface apparatus 140 may intercept the command bus 225. In addition, the interface apparatus 140 may intercept the data/address bus 230 and the clock bus 220. The intercepted command bus 225, data/address bus 230, and the clock bus 220 continue to the DRAM 130. The interface apparatus 140 may generate NVRAM data/address bus signals 260, NVRAM command signals 255, and NVRAM clock 250 from commands from the command bus 225, the data/address bus 230, and the clock bus 220 as will be described hereafter. The NVRAM data/address bus signals 260 may include read lines. In addition, the NVRAM data/address bus signals 260 may include sense lines.

The NVRAM 115 may receive a NVRAM power bus 265 from the power supply 145. The interface apparatus 140 may generate an NVRAM power control 275 that controls the NVRAM power bus 265. The DRAM 130 may receive DRAM power bus 270 from the power supply 145. The DRAM power bus 270 may be separate and distinct from the NVRAM power bus 265. Alternatively, the DRAM power bus 270 and the NVRAM power bus 265 may be electrically equivalent.

Figure 3A:
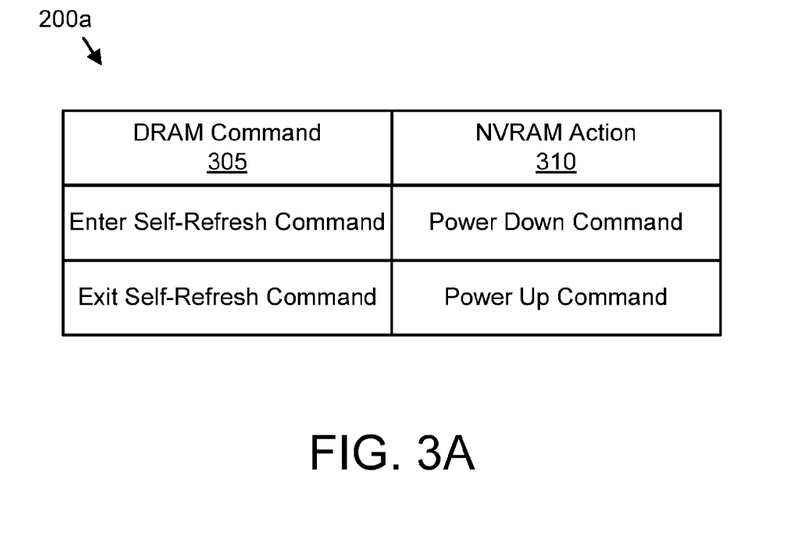
FIG. 3A is a schematic block diagram illustrating one embodiment of a command conversion table.

FIG. 3A is a schematic block diagram illustrating one embodiment of a command conversion table 200a. The command conversion table 200a may be embodied in a state machine. Alternatively, the command conversion table 200a may be embodied in a lookup table stored in one or more hardware registers. In one embodiment, the command conversion table 200a is incorporated in the interface apparatus 140.

In one embodiment, the command conversion table 200a generates NVRAM actions 310 in response to DRAM commands 305. The DRAM commands 305 may be received from the command bus 225. The NVRAM actions 310 may be performed by issuing NVRAM command signals 255 corresponding to the NVRAM actions 310.

In one embodiment, the interface module 140 communicates a power down command over the NVRAM command signals 255 in response to intercepting an enter self-refresh command from the command bus 225. The power down command may cause the NVRAM 115 to power down until the NVRAM 115 receives a power up command as will be described hereafter.

The interface module 140 may communicate a power up command over the NVRAM command signals 255 in response to intercepting an exit self-refresh command from the command bus 225. The power up command may cause the NVRAM 115 to power up as will be described hereafter.

Figure 3B:
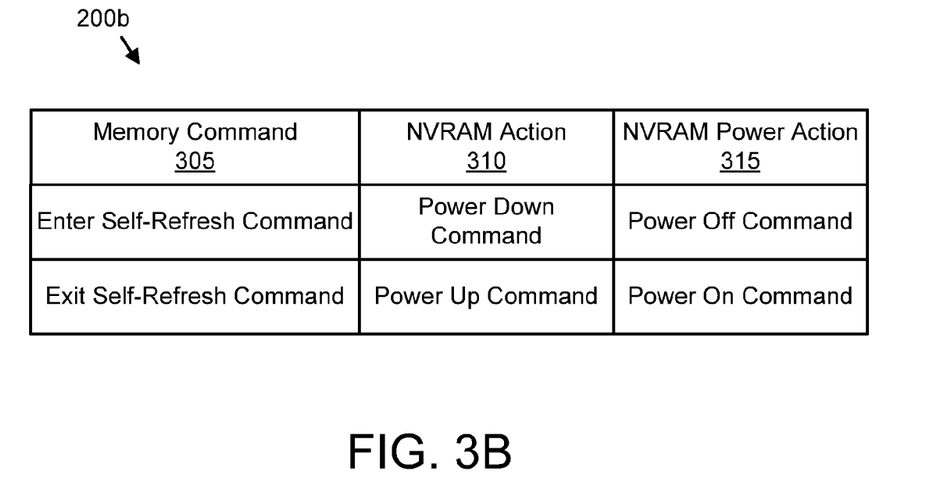
FIG. 3B is a schematic block diagram illustrating one alternate embodiment of a command conversion table.

FIG. 3B is a schematic block diagram illustrating one alternate embodiment of a command conversion table 200b. The command conversion table 200b includes the functions of the command conversion table 200a of FIG. 3A with additional functions for managing the NVRAM power bus 265. The command conversion table 200b may be embodied in a state machine. Alternatively, the command conversion table 200b may be embodied in a lookup table stored in one or more hardware registers. In one embodiment, the command conversion table 200b is incorporated in the interface apparatus 140.

In one embodiment, the interface module 140 communicates the power down command over the NVRAM command signals 255 in response to intercepting the enter self-refresh command from the command bus 225. In addition, the interface module 140 may communicate a power off command over the NVRAM power control 275 to the power supply 145. The power supply 145 may de-energize the NVRAM power bus 265 in response to the power off command as will be described hereafter.

The interface module 140 may communicate a power up command over the NVRAM command signals 255 in response to intercepting an exit self-refresh command from the command bus 225. The power up command may cause the NVRAM 115 to power up. In addition, the interface module 140 may communicate a power on command over the NVRAM power control 275 to the power supply 145. The power supply 145 may energize the NVRAM power bus 265 in response to the power on command as will be described hereafter.

Figure 4:
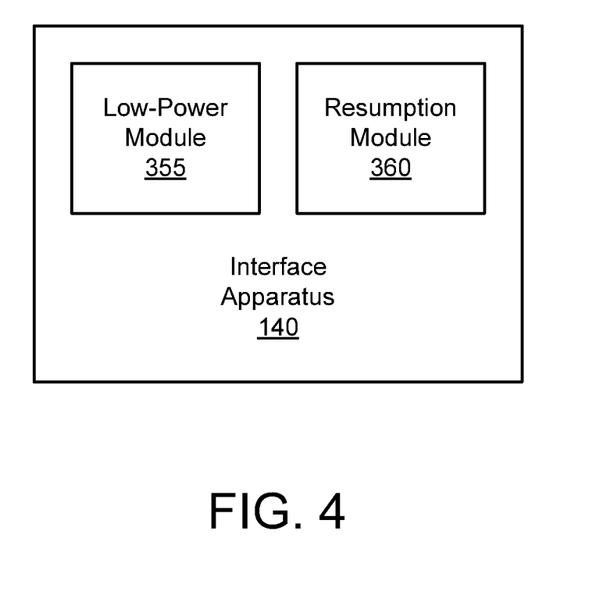
FIG. 4 is a schematic block diagram illustrating one embodiment of an interface apparatus.

FIG. 4 is a schematic block diagram illustrating one embodiment of the interface apparatus 140. In a certain embodiment, the interface apparatus 140 is embodied in a discreet semiconductor device. Alternatively, interface apparatus 140 may be embodied in a semiconductor device comprising other control logic. In a certain embodiment, the interface apparatus 140 is embodied in the memory controller 120.

The interface apparatus 140 includes a low-power module 355 and a resumption module 360. The low-power module 355 and the resumption module 360 may each comprise a plurality of logic gates and/or registers.

The low-power module 355 may intercept the memory self-refresh command and power down the NVRAM 115 in response to the memory self-refresh command. The resumption module 360 may intercept the memory wait command and power up the NVRAM 115 in response to the memory wait command as will be described hereafter.

Figure 5:
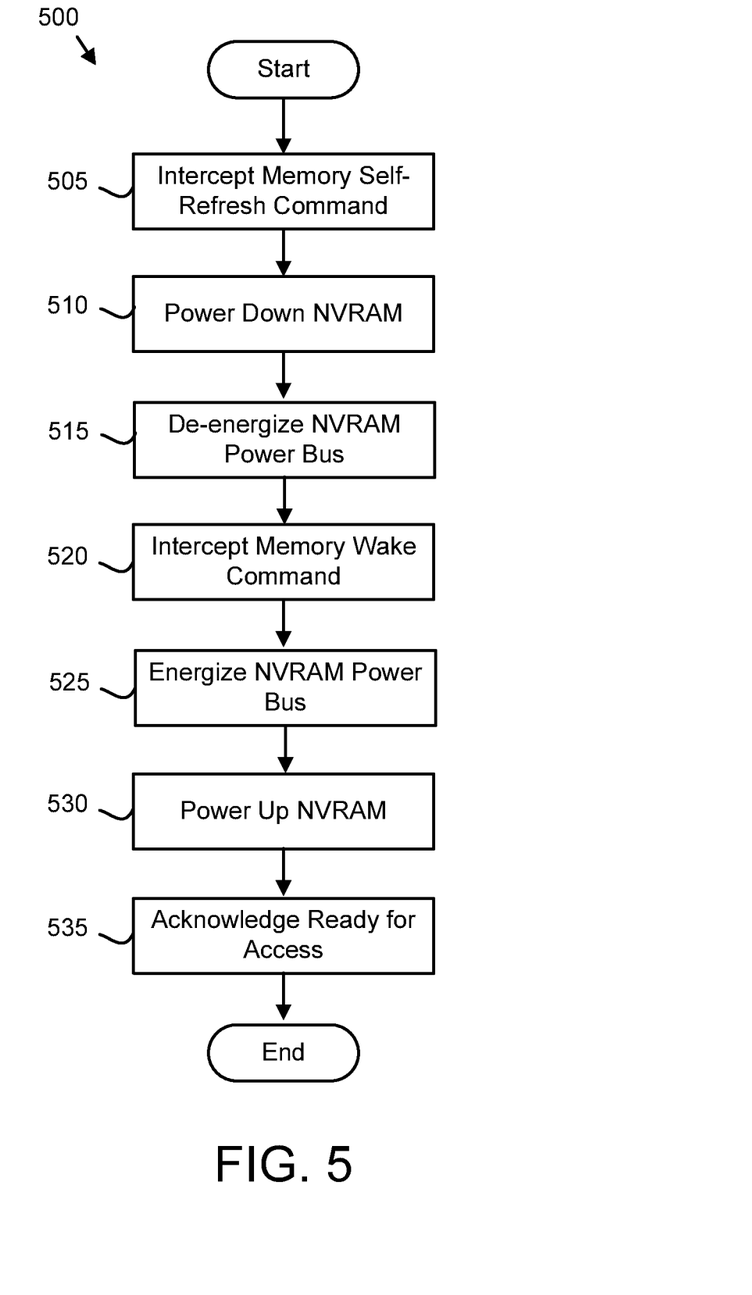
FIG. 5 is a schematic flow chart diagram illustrating one embodiment of a power management method.

FIG. 5 is a schematic flow chart diagram illustrating one embodiment of a power management method 500. The method 500 may perform the functions of the computing device 100 and the interface apparatus 140. The method 500 may be performed by hardware logic. Alternatively, the method 500 may be performed by a processor such as a sequencer executing code stored in a computer readable storage medium.

The method 500 starts, and in one embodiment the low-power module 355 intercepts 505 the memory self-refresh command. The memory self-refresh command may be a LPDDR enter self-refresh command. In one embodiment, the memory self-refresh command is communicated over the command bus 225. The interface module 140 may be in communication with the command bus 225 and may receive the memory self-refresh command. In one embodiment, the low-power module 355 decodes the memory self-refresh command.

The low-power module 355 may power down 510 the NVRAM 115 in response to intercepting the memory self-refresh command. In one embodiment, the low-power module 355 may power down 510 the NVRAM by issuing the power down command as NVRAM command signals 255.

In one embodiment, the low-power module 355 further de-energizes 515 the NVRAM power bus 265. The low-power module 355 may communicate a power off command over the NVRAM power control 275 to the power supply 145. The power supply 145 may de-energize 515 the NVRAM power bus 265 in response to the power off command.

In one embodiment, the low-power module 355 also de-energizes the NVRAM clock 250 and the NVRAM read and sense lines of the NVRAM data/address bus signals 260. In addition, the low-power module 355 may de-energize all of the NVRAM data/address bus signals 260. The low-power module 355 may also de-energize the NVRAM command signals 255.

The resumption module 360 may intercept 520 the self-refresh exit command. The self-refresh exit command may be a LPDDR exit self-refresh command. The self-refresh exit command may be communicated over the command bus 225. The resumption module 360 may receive the memory self-refresh command from the command bus 225.

The resumption module 360 may further energize 525 the NVRAM power bus 265. In one embodiment, the resumption module 360 communicates a power on command over the NVRAM power control 275 to the power supply 145. The power supply 145 may energize 525 the NVRAM power bus 265 in response to the power on command.

The resumption module 360 may power up 530 the NVRAM 115. In one embodiment, the resumption module 360 communicates a power up command over the NVRAM command signals 255 to the NVRAM 115. The NVRAM 115 may power up in response to receiving the power of command.

In one embodiment, the resumption module 360 acknowledges the NVRAM 115 is ready for access and the method 500 ends. The resumption module 360 may communicate the acknowledgment over the command bus 225 to the memory controller 120.

Figure 6:
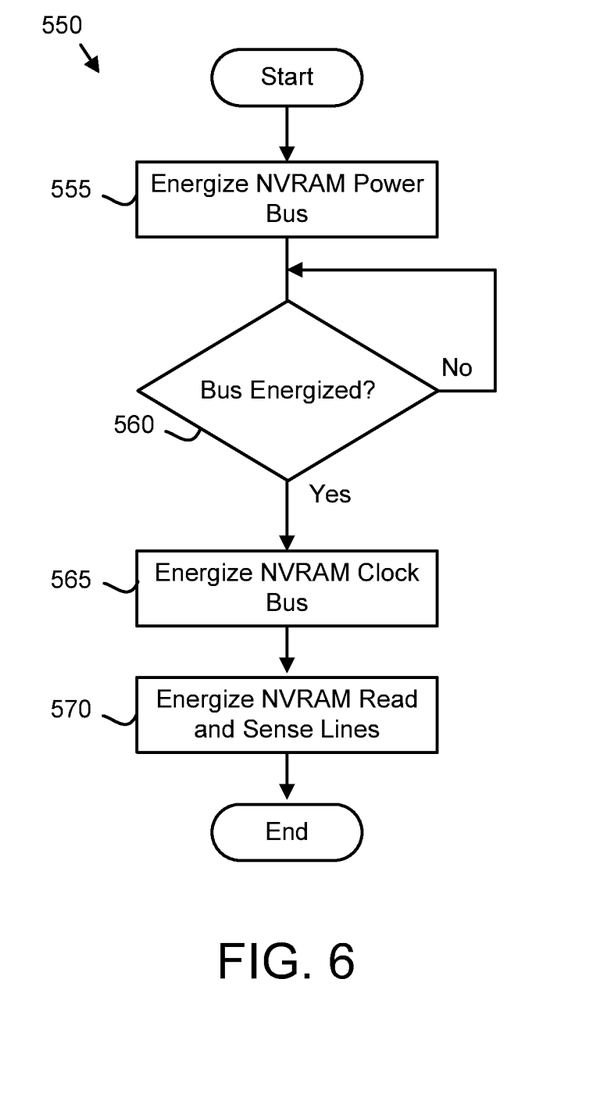
FIG. 6 is a schematic flow chart diagram illustrating one embodiment of a power up method.

FIG. 6 is a schematic flow chart diagram illustrating one embodiment of a power up method 550. The method 550 may perform the functions of the computing device 100 and the interface apparatus 140. In one embodiment, the method 550 performs the energize NVRAM power bus step 525 and the power up NVRAM step 530 of FIG. 5. The method 550 may be performed by hardware logic. Alternatively, the method 550 may be performed by a processor such as a sequencer executing code stored in a computer readable storage medium.

The method 550 starts, and in one embodiment the power supply 145 energizes 550 the NVRAM power bus 265. In one embodiment, the power supply 145 energizes 550 the NVRAM power bus 265 in response to the resumption module 360 communicating a power on command over the NVRAM power control 275 to the power supply 145. The resumption module 360 may further determine 560 whether the NVRAM power bus 265 is energized. In one embodiment, the resumption module 360 samples the NVRAM power bus 265 to determine if the NVRAM power bus 265 is energized.

Alternatively, the power supply 145 may indicate that the NVRAM power bus 265 is energized over the NVRAM power control 275.

If the NVRAM power bus 265 is not energized, the resumption module 360 continues to determine 560 whether the NVRAM power bus 265 is energized. If the NVRAM power bus 265 is energized, the resumption module 360 may energize 270 the NVRAM clock 250.

In one embodiment, the resumption module 360 energizes 570 the NVRAM read incense lines in response to energizing the NVRAM power bus 265 and the method 550 ends. In a certain embodiment, the resumption module 360 energizes 570 all the NVRAM data/address bus signals 260.

By intercepting the memory self-refresh command directed to the DRAM 130, the embodiments may power down the NVRAM 115. In addition, by intercepting the self-refresh exit command directed to the DRAM 130 the embodiments may also power up the NVRAM 115. Thus the embodiments may manage the power consumption of the NVRAM 115 using the power management commands for the DRAM 130. As a result, memory controller power management logic that is designed for the DRAM 130 may also be employed for NVRAM power management.

Embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus comprising:
   a low-power module that intercepts an enter self-refresh command communicated over a command bus to a Dynamic Random Access Memory (DRAM) and powers down a non-volatile random access memory (NVRAM) in response to the enter self-refresh command, wherein the NVRAM is magnetoresistive random-access memory (MRAM); and
   a resumption module that intercepts an exit self-refresh command and powers up the NVRAM in response to the exit self-refresh command by energizing an NVRAM power bus, energizing an NVRAM clock, and energizing NVRAM read and sense lines.

2. The apparatus of claim 1, wherein the enter self-refresh command is a low-power double data rate (LPDDR) enter self-refresh command.

3. The apparatus of claim 1, wherein the exit self-refresh command is a LPDDR exit self-refresh command.

4. The apparatus of claim 1, wherein the resumption module generates a power on command that energizes the NVRAM power bus.

5. The apparatus of claim 1, wherein the resumption module further acknowledges the NVRAM is ready for access.

6. The apparatus of claim 1, wherein the low-power module further generates a power off command that de-energizes an NVRAM power bus to power down the NVRAM.

7. A system comprising:
   a processor;
   a dynamic random access memory (DRAM) that stores code;
   a memory controller that controls the DRAM;
   a non-volatile random access memory (NVRAM) that stores code, wherein the NVRAM is magnetoresistive random-access memory (MRAM);
   a low-power module that intercepts an enter self-refresh command communicated over a command bus from the memory controller to the DRAM and powers down the NVRAM in response to the enter self-refresh command; and
   a resumption module that intercepts an exit self-refresh command from the memory controller to the DRAM and powers up the NVRAM in response to the exit self-refresh command by energizing an NVRAM power bus, energizing an NVRAM clock, and energizing NVRAM read and sense lines.

8. The system of claim 7, wherein the enter self-refresh command is a low-power double data rate (LPDDR) enter self-refresh command.

9. The system of claim 7, wherein the exit self-refresh command is a LPDDR exit self-refresh command.

10. The system of claim 7, wherein the resumption module generates a power on command that energizes the NVRAM power bus.

11. The system of claim 7, wherein the resumption module further acknowledges the NVRAM is ready for access.

12. The system of claim 7, wherein the low-power module further generates a power off command that de-energizes an NVRAM power bus to power down the NVRAM.

13. A method comprising:
   intercepting an enter self-refresh command communicated over a command bus to a Dynamic Random Access Memory (DRAM);
   powering down a non-volatile random access memory (NVRAM) in response to the enter self-refresh command, wherein the NVRAM is magnetoresistive random-access memory (MRAM);
   intercepting an exit self-refresh command; and
   powering up the NVRAM in response to the exit self-refresh command by energizing an NVRAM power bus, energizing an NVRAM clock, and energizing NVRAM read and sense lines.

14. The method of claim 13, wherein the enter self-refresh command is a low-power double data rate (LPDDR) enter self-refresh command.

15. The method of claim 13, wherein the exit self-refresh command is a LPDDR exit self-refresh command.

16. The method of claim 13, the method further acknowledging the NVRAM is ready for access.

17. The method of claim 13, the method further generating a power off command that de-energizes an NVRAM power bus to power down the NVRAM.

* * * * *